(12) United States Patent
Ohta

(10) Patent No.: US 6,524,351 B2
(45) Date of Patent: Feb. 25, 2003

(54) SEMICONDUCTOR DEVICE MOUNTING JIG

(75) Inventor: Kazuya Ohta, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 10/050,269

(22) Filed: Jan. 16, 2002

(65) Prior Publication Data
US 2002/0108238 A1 Aug. 15, 2002

Related U.S. Application Data

(62) Division of application No. 09/588,289, filed on Jun. 7, 2000, now Pat. No. 6,444,492.

Foreign Application Priority Data

Jun. 15, 1999 (JP) .............................................. 11-168091

(51) Int. Cl.[7] ......................... H01L 21/00; H01L 21/64
(52) U.S. Cl. ....................................... 29/25.01; 269/21
(58) Field of Search ........................... 29/25.01; 269/21

(56) References Cited

U.S. PATENT DOCUMENTS 6,046,076 A * 4/2000 Mitchell et al. ............ 438/106
6,169,328 B1 * 1/2001 Mitchell et al. ............ 257/675

* cited by examiner

Primary Examiner—David E. Graybill
(74) Attorney, Agent, or Firm—Sonnenschein, Nath & Rosenthal

(57) ABSTRACT

A semiconductor device mounting jig capable of holding a flexible tape substrate or other board flat and stable, provided with a holding plate having a flat mounting board holding surface integrally formed at an opening of a plate support having a hollow portion inside and having the opening communicated with the hollow portion or fit in the opening of the plate support through an O-ring, suction holes penetrating through the holding plate at the mounting board holding surface, and a suction means for applying suction at the suction holes from the opposite side to the mounting board holding surface such as applying suction at the hollow portion of the plate support, the mounting board being placed on the mounting board holding surface to cover the suction holes and the suction means applying suction to the hollow portion to hold and fix the mounting board by suction, and a method of mounting a semiconductor device using the same.

5 Claims, 8 Drawing Sheets

SEMICONDUCTOR DEVICE MOUNTING JIG

RELATED APPLICATION DATA

The present application is a division of Ser. No. 09/588,289 filed Jun. 7, 2000, U.S. Pat. No. 6,444,492, and to Japanese Application No. P11-168091 filed Jun. 15, 1999, each of which is incorporated herein by reference to the extent permitted by law.

BACKGROUND OF THE INVENTION

1. Field of the Invention

The present invention relates to a semiconductor device mounting jig and a method of mounting a semiconductor device, more particularly relates to a method of mounting a semiconductor device having a package form made to be compact and high density and a semiconductor device mounting jig used therefor.

2. Description of the Related Art

Demand for more compact, thinner, and lighter digital video cameras, digital cellular phones, laptop personal computers, and other portable electronic devices has been increasing steadily. To meet the demand, a 70% reduction in three years has been realized and smaller sizes and high performance have been achieved in recent VLSIs and other semiconductor devices.

Along with the higher performance of semiconductor devices, semiconductor device packages have been made smaller and higher in number of pins. There has been a shift from the conventionally broadly used dual inline packages (DIP) and other through hole mount devices (THD) inserting leads into through holes formed in a printed board to quad flat (L-leaded) packages (QFP) and other surface mount devices (SMD) mounted by soldering lead terminals on the surface of a board and further to ball grid array (BGA) packages with output terminals provided at areas on the bottom surface.

Further, a package called a chip size package (CSP), also called a fine-pitch BGA (FBGA), having terminals on its bottom surface, making the package size close to the size of the semiconductor chip, and realizing further compactness and higher density has been developed and put into broad use up to now.

As the method of mounting a semiconductor chip of the above CSP format, flip-chip mounting for directly mounting a bare LSI chip with the pad opening surface side facing to the mounting board or mounting an LSI chip to a buffer base called an "interposer" to make a CSP and mounting this on a mounting board has come into note.

In flip-chip mounting, the LSI chip is provided with projecting electrodes such as gold stud bumps and solder bumps.

Flip-chip mounting using solder bumps enables simultaneous mounting of a large number of LSI chips when using reflow of the solder bumps, so the productivity is extremely high. Also, compared with connection using gold stud bumps, there is the advantage that bonding with a low load is possible.

Generally, in flip-chip mounting using reflow of the solder bumps, a rigid substrate comprised of glass-epoxy etc. is used.

On the other hand, flip-chip mounting may also be conducted using a flexible tape substrate formed by processing polyimide or another insulating resin to a tape shape and having the advantage of being thin and light weight.

However, since a flexible tape substrate is more flexible than a rigid substrate, a flexible tape substrate easily flexes in the process of mounting an LSI chip by flip-chip mounting, therefore easily suffers from problems in connection of the solder bumps described below.

When, for example as shown in FIG. 9, mounting a semiconductor device 5 comprised of an LSI chip 50, electrodes 51 connected to its pads, and solder bumps 52 formed on the electrodes, on to a flexible tape substrate 4 comprised of a highly flexible substrate 40 on which lands (electrodes) 41a are formed, if mounting by reflow of the solder bumps while the flexible tape substrate 4 is left flexed, unconnected portions U arise between the solder bumps 52 and lands 41a, and alternatively, in the case of a semiconductor 5 having a narrow pitch P between adjacent solder bumps 52, bridges B occur between adjacent solder bumps 52 and other problems arise easily in solder bump connection.

To prevent the above disadvantages in solder bump connection, it is necessary to keep the flexible tape substrate 4 flat during especially narrow pitch P flip-chip soldering by reflow.

As a method of reflow while keeping the flexible tape substrate 4 flat, a method of affixing the flexible tape substrate 4 on a holding base using an adhesive tape (see Japanese Unexamined Patent Publication (Kokai) No. 8-222820) and a method of forming through holes in the flexible tape substrate 4 in advance and affixing the flexible tape substrate 4 by fitting them over projections formed on the holding base (see Japanese Unexamined Patent Publication (Kokai) No. 8-254996) have been proposed.

The above two methods, however, have disadvantages that the area for holding the flexible tape substrate 4 is small, the holding force is weak, and the flexible tape substrate 4 sometimes comes off from the holding base.

Also, a method of affixing the flexible tape substrate 4 on the holding base by an adhesive or two-sided adhesive tape may be considered.

In this case, however, at the time of release, that is, detaching the flexible tape substrate 4 from the holding base, stress ends up being imposed on the semiconductor device. The semiconductor device is liable to be damaged in some cases.

SUMMARY OF THE INVENTION

An object of the present invention is to provide a semiconductor device mounting jig capable of stably holding a flexible tape substrate flat in a process of mounting a semiconductor device on the flexible tape substrate by flip-chip mounting and not applying stress to the semiconductor device at the time of release and a method of mounting a semiconductor device mounted on a flexible tape substrate by using the semiconductor device mounting jig.

To attain the above object, according to a first aspect of the present invention, there is provided a semiconductor device mounting jig for holding a mounting board flat when mounting a semiconductor device on the mounting board, comprising a holding plate having a flat mounting board holding surface; suction holes penetrating through the holding plate at the mounting board holding surface; and a suction means for applying suction at the suction holes from an opposite side to the mounting board holding surface; suction being applied at the suction holes while the mounting board is placed on the mounting board holding surface so as to hold the mounting board by suction.

Preferably, the holding plate is fit into an opening of a plate support having a hollow portion inside it and the opening communicated with the hollow portion and the suction means applies suction to the hollow portion to apply suction at the suction holes from the opposite side to the mounting board holding surface.

Preferably, a suction nozzle communicating with the hollow portion is provided at the plate support; and a suction pump is connected to the suction nozzle to apply suction to the hollow portion.

More preferably, a valve for opening and shutting the suction nozzle is provided at the suction nozzle; and the suction pump can be attached to or removed from the suction nozzle.

Preferably, the holding plate and the plate support are made as one body.

Preferably, the holding plate is fit into the opening of the plate support through an O-ring.

That is, the above semiconductor device mounting jig of the present invention comprises a holding plate having a flat mounting board holding surface integrally formed at an opening of a plate support having a hollow portion inside it and the opening communicated with the hollow portion or fitted in the opening of the plate support through an O-ring, suction holes in the mounting board holding surface penetrating through the holding plate, and a suction means for applying suction at the suction holes from the opposite side to the mounting board holding surface such as applying suction at the hollow portion of the plate support.

Accordingly, by placing a mounting board on the mounting base holding surface while applying suction from the suction holes, the flexible tape substrate is held by suction and kept flat and stable in the process of mounting a semiconductor device on a flexible tape substrate by flip-chip mounting etc. Further, the hold can be easily released by releasing suction to return to a normal pressure, so no stress is imposed on the semiconductor device.

Further, when configured so that a valve is provided at the suction nozzle and a suction pump can be attached to or removed from the suction nozzle, after holding the mounting board on the mounting board holding surface, the mounting board can be kept held even if the suction pump is removed from the suction nozzle by closing the valve of the suction nozzle.

According to a second aspect of the present invention, there is provided a method of mounting a semiconductor device, comprising steps of placing a mounting board on a flat mounting board holding surface of a semiconductor device mounting jig comprising a holding plate having the mounting board holding surface, suction holes penetrating through the holding plate at the mounting board holding surface, and a suction means for applying suction at the suction holes from an opposite side to the mounting board holding surface, and applying suction at the suction holes to hold the mounting board; placing a semiconductor device on the mounting board; and connecting the semiconductor device to the mounting board.

Preferably, a flexible tape substrate comprising a substrate made of an insulating resin processed to form a tape shape and formed with an interconnection pattern is used as the mounting board; in the step of placing the semiconductor device, the semiconductor device is placed so that bumps formed previously on the semiconductor device contact the interconnection pattern; and in the step of connecting the semiconductor device to the mounting board, the bumps are connected to the interconnection pattern.

Preferably, in the step of connecting the semiconductor device to the mounting board, the semiconductor device is connected with solder to the mounting board.

More preferably, in the step of connecting the semiconductor device to the mounting board, the semiconductor device is connected to the mounting board by reflow of the solder.

Preferably, the method further includes, after connecting the semiconductor device to the mounting board, a step of injecting a sealing resin in a gap between the mounting board and the semiconductor device in the state holding the mounting board on the mounting board holding surface of the semiconductor device mounting jig and a step of hardening the sealing resin to seal the gap between the mounting board and the semiconductor device in the state holding the mounting board on the mounting board holding surface.

That is, the method of mounting a semiconductor device of the present invention places on the mounting board holding surface of a semiconductor device mounting jig provided with a holding plate having a flat mounting board holding surface, suction holes penetrating through the holding plate at the mounting board holding surface, and a suction means for applying suction at the suction holes from the opposite side to the mounting board holding surface—a flexible tape substrate or other mounting board comprising a substrate comprised of an insulating resin formed to a tape shape and formed with an interconnection pattern and applies suction from suction holes so as to hold the mounting board.

Next, a semiconductor device is mounted on the mounting board while bringing bumps formed in advance on the semiconductor device to contact with the interconnection pattern of the mounting board.

Then, the semiconductor device is connected to the mounting board by connecting the interconnection pattern etc. to the bumps by reflow etc.

According to the method of mounting a semiconductor device of the present invention, by placing a mounting board on the mounting board holding surface while applying suction at suction holes, it is possible to apply suction to a flexible tape substrate or other mounting board to hold it flat and stable and to mount a semiconductor device on the mounting board by flip-chip mounting etc. Also, by releasing the suction to return to a normal pressure, the hold can be released without imposing any stress on the semiconductor device.

Furthermore, by injecting a sealing resin in the gap between the mounting board and the semiconductor device in the state holding the mounting board on the mounting board holding surface and hardening the sealing resin, it is possible to seal with resin in the state holding the flexible tape substrate or other mounting board flat and stable.

BRIEF DESCRIPTION OF THE DRAWINGS

These and other objects and features of the present invention will become clearer from the following description of the preferred embodiments given with reference to the accompanying drawings, in which:

FIGS. 3A and 3B are schematic sectional view of steps of a method of mounting a semiconductor device according to an embodiment of the present invention, wherein FIG. 3A is a view up to a step of holding a mounting board and FIG. 3B is a view up to a step of mounting the semiconductor device;

FIGS. 4A and 4B are schematic sectional views of the following steps of FIGS. 3A and 3B, wherein FIG. 4A is a view up to a step of soldering by reflow and FIG. 4B is a view up to a step of releasing the mounting board;

FIGS. 5A and 5B are schematic sectional views of steps of a method of mounting a semiconductor device according embodiment of the present invention, wherein FIG. 5A is a view up to the step of soldering by reflow and FIG. 5B is a view up to a step of flux washing;

FIGS. 6A and 6B are schematic sectional views of following steps of FIGS. 5A and 5B, wherein FIG. 6A is a view up to a step of resin sealing and FIG. 6B is a view up to a step of releasing the mounting board;

DESCRIPTION OF THE PREFERRED EMBODIMENTS

Below, preferred embodiments of a semiconductor device 5 mounting jig 100 of the present invention and a method of mounting the semiconductor device 5 using the same will be described with reference to the accompanying drawings.

Figure 1A:
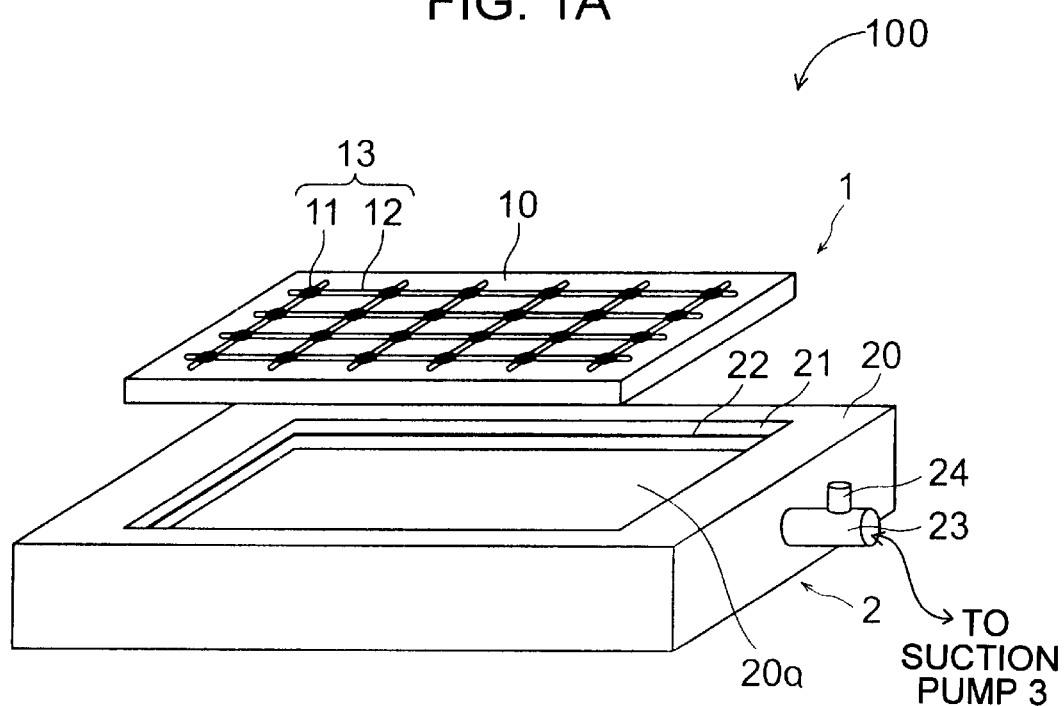
FIGS. 1A and 1B are perspective views of a semiconductor device mounting jig according to the present invention.

FIG. 1A is a perspective view of the configuration of a semiconductor device 5 mounting jig 100 according to the present invention.

The semiconductor device 5 mounting jig 100 comprises a holding plate 1 and a plate support 2.

The holding plate 1 is formed by a suction plate 10 having a flat mounting board holding surface provided with a suction pattern 13 comprised of suction holes 11 and grooves 12.

The suction holes 11 are formed penetrating through the suction plate 10 from the side holding the flexible tape substrate 4 etc., that is, the mounting board holding surface, to the opposite side. The suction holes 11 are essential parts for holding by suction and preferably have hole diameters of 0.01 to 1 mm.

On the other hand, the grooves 12 are formed in the suction plate 10 at the mounting board holding surface. The grooves 12 are additional parts for holding the flexible tape substrate 4 more reliably and preferably have a width of 0.1 to 1 mm. The grooves 12 can be omitted if not necessary.

The suction plate 10 is preferably made by a material superior in flatness, easy to make holes in or otherwise machine, and with little heat deformation when heated to a peak temperature of reflow (generally 230 to 2400° C.) or so and, for example, is made from stainless steel, ceramics, etc.

The plate support 2 is comprised of a plate support body 20 in which is formed a hollow portion 20a. An opening 21 is formed communicating with the hollow portion 20a. An O-ring 22 is provided at an inner wall of the opening 21. The holding plate 1 is fit in the opening 21 through the O-ring 22 at the time of use.

Also, at least one suction nozzle 23 is provided communicated with the hollow portion 20a and a valve 24 is provided for maintaining the reduced pressure state of the hollow portion 20a reduced in pressure by suction. The suction nozzle 23 is connected to a not illustrated suction pump 3. The suction pump 3 is detachable.

The plate support body 20 is preferably made by a material easy to make holes in, form a hollow portion in, or otherwise machine, and with little heat deformation when heated to the peak temperature (generally, 230 to 240° C.) of reflow or so and is formed for example by stainless steel, ceramics, etc.

Figure 1B:
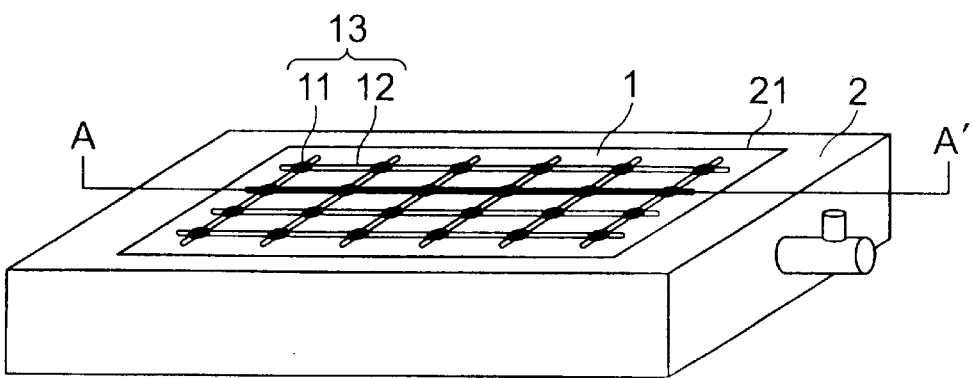

FIG. 1B is a perspective view of a semiconductor device 5 mounting jig 100 (mounting board holding jig 100) according to the present invention and shows the state of assembly after fitting the holding plate 1 in the opening 21 of the plate support 2 through the O-ring 22.

Figure 2:
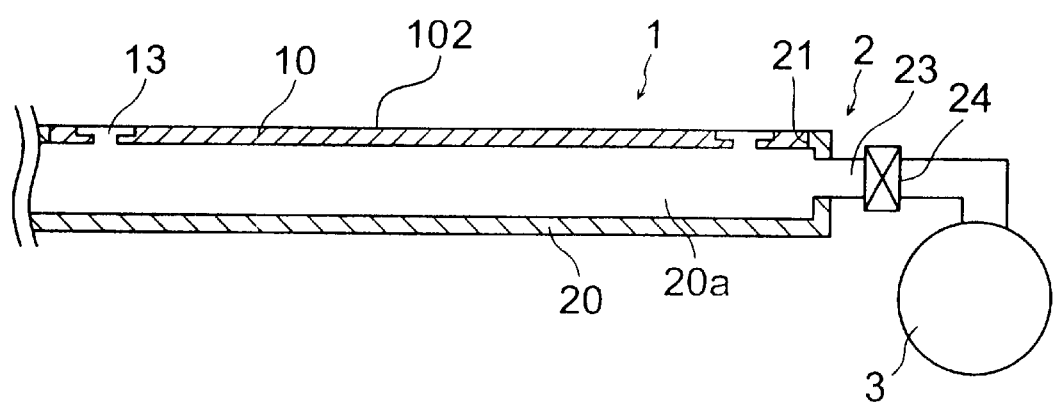
FIG. 2 is a schematic sectional view corresponding to a part of a sectional view along the line A–A' in FIG. 1B.

FIG. 2 is a schematic sectional view corresponding to a part of a sectional view along the line A–A' in FIG. 1B.

The plate support 2 is comprised of the plate support body 20 inside of which is provided the hollow portion 20a and provided with the opening 21 communicated with the hollow portion 20a.

The holding plate 1 comprised of the suction plate 10 provided with a suction pattern 13 comprised of suction holes 11, grooves 12, etc. is fitted in the opening 21 through the not shown O-ring 22.

Also, at least one suction nozzle 23 is provided communicated with the hollow portion 20a and a valve 24 is provided for maintaining the reduced pressure state of the hollow portion 20a reduced in pressure by suction. The suction nozzle 23 is connected to a suction pump 3. The suction pump 3 is detachable.

In the above mounting board holding jig 100, the hollow portion 20a is reduced in pressure by applying suction by the suction pump 3 in the state with the board 4 to be held placed on the mounting board holding surface 102 of the suction plate 10 and covering the suction pattern 13 so that the holding plate 1 and the plate support 2 are fixed and the board 4 is held and fixed by the suction pattern 13.

After the hollow portion 20a is once reduced in pressure, the reduced pressure state is maintained, even when the suction pump 3 is removed, by closing the valve 24. The held board 4 therefore continues to be held by suction by the suction pattern 13.

In the above mounting board holding jig 100, the flatness of the flexible tape substrate 4 or other held board 4 may be damaged by the suction pattern. To prevent this, the suction pattern 13 is preferably designed, considering the arrangement of electrodes (lands) 41a of the flexible tape substrate 4 or other board 4 to be soldered, so that the suction holes 11, grooves 12, etc. are not arranged directly below the electrodes (lands) 41a.

The mounting board holding jig 100 of the present embodiment is configured so that the suction plate 10 is detachable and is therefore capable of handling mounting boards 4 having a variety of electrode patterns 41 by just changing the suction pattern 13 of the suction plate 10, therefore can be widely used.

The method of mounting a semiconductor device 5 on a flexible tape substrate 4 by using the above mounting board holding jig 100 will be explained next by referring to a schematic sectional view corresponding to FIG. 2, which is a schematic sectional view corresponding to a part of a sectional view along the line A–A' in FIG. 1B. Simultaneous mounting of a large number of semiconductor devices 5 is possible by using a large number of semiconductor devices 5 (LSI chips) and a corresponding mounting board 4 (flexible tape substrate 4).

Figure 3A:
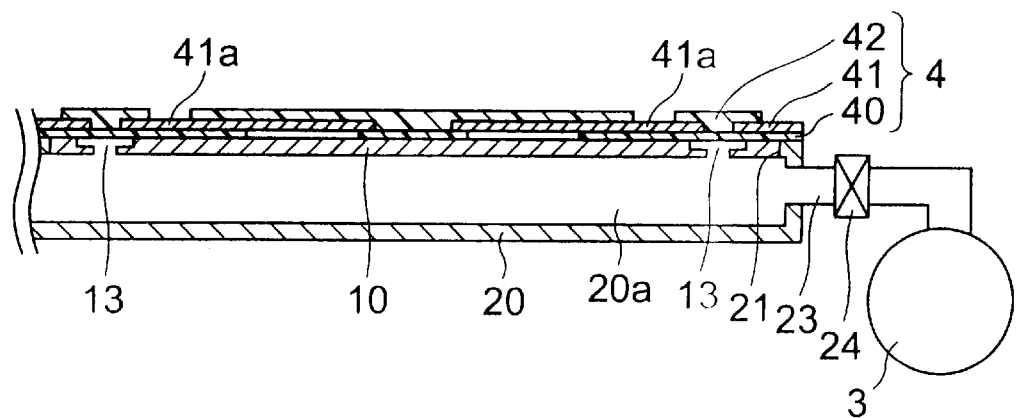

First, as shown in FIG. 3A, the suction pump 3 is operated in the state with the flexible tape substrate 4 placed on the mounting board holding surface 102 of the suction plate 10 and covering the suction pattern 13. As a result, the hollow portion 20a is reduced in pressure, the holding plate 1 and support 2 are fixed, and the held board 4 is further held and fixed by suction by the suction pattern 13.

The above flexible tape board 4 comprises a conductive pattern 41 and insulation portions (40, 42). A part of the conductive pattern 41 exposed from an opening of the insulation portions (40, 42) becomes a land (electrode) 41a.

Preferably, the conductive pattern 41 is made of a metal having a low resistance. For example, copper may be used.

The insulation portions (40, 42) preferably are made of a resin having a low dielectric constant. For example, a polyimide resin or epoxy resin may be used. The insulation portions (40, 42) are preferably formed on both sides of the conductive pattern 41. Also, the insulation portions (40, 42) formed on the two sides of the conductive pattern 41 do not necessarily have to be the same material.

The thickness of the flexible tape substrate 4 is for example not more than 0.5 mm, preferably 0.05 to 0.2 mm.

Next, after the hollow portion 20a is reduced in pressure and the suction pattern 13 holds the flexible tape substrate 4 by suction, the valve 24 is closed and the suction pump 3 is removed while maintaining the reduced pressure state of the hollow portion 20a. Since the valve 24 of the suction nozzle 23 is closed, the held state of the flexible tape substrate 4 can be maintained even if the suction pump 3 is removed from the suction nozzle 23.

As explained above, the flexible tape substrate 4 is held and fixed flat by suction by the mounting board holding jig 100 having a holding plate 1 with a flat surface.

Figure 3B:
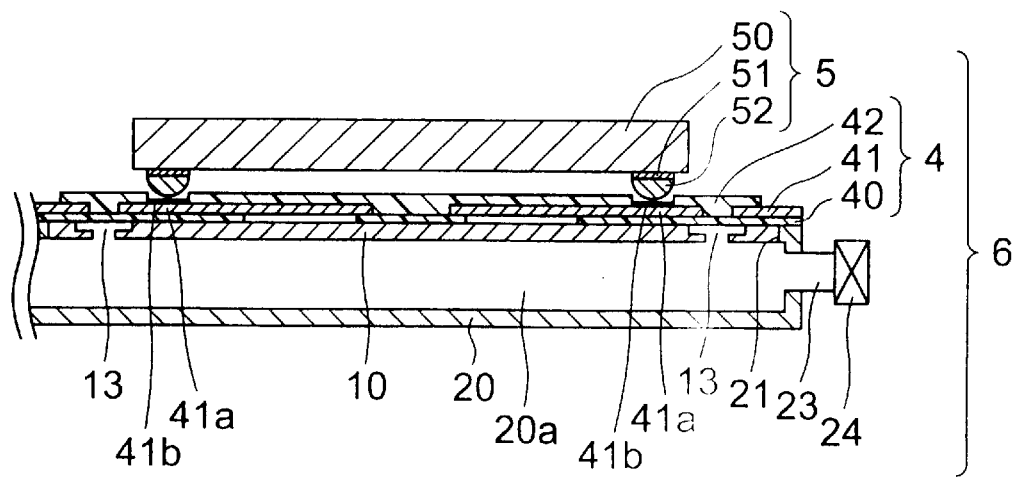

Next, as shown in FIG. 3B, flux 41b is supplied to the lands 41a of the held flexible tape substrate 4, then a semiconductor device 5 comprised of a semiconductor chip 50 connected in its pad openings with a ball limiting metal (BLM) 51 or other conductive film and solder ball bumps 52 formed on the same is mounted on the flexible tape substrate 4 with the lands 41a and solder ball bumps 52 aligned. This state will be called the "work 6".

Figure 4A:
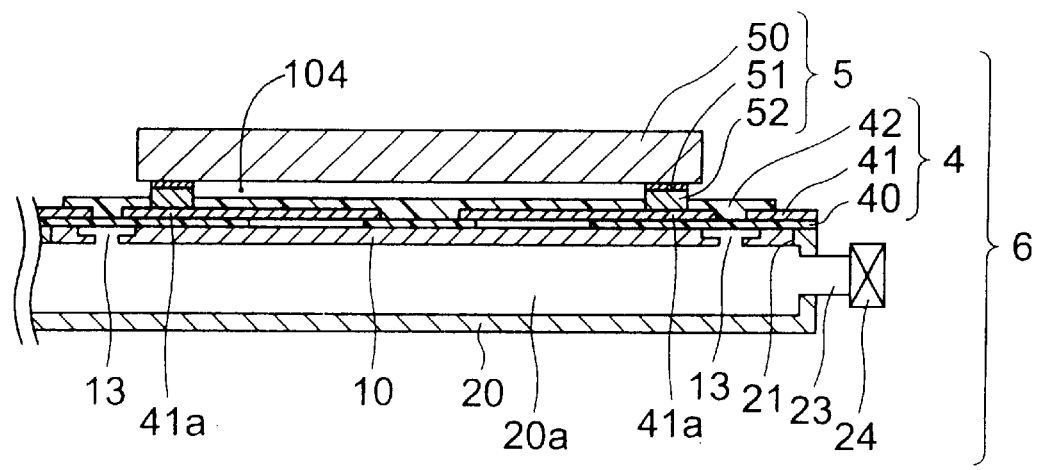

Next, as shown in FIG. 4A, the work 6 is passed through a reflow furnace to heat it higher than the solder melting temperature and melt the solder bumps 52. At this time, the oxide film on the solder portions 52 and land portions 41a is removed by the flux and the solder 52 wets the lands 41a of the flexible tape substrate 4. By cooling and hardening the solder 52 in this state, soldering (reflow) is conducted to electrically and mechanically connect the semiconductor device 5 and the flexible tape substrate 4.

Figure 4B:
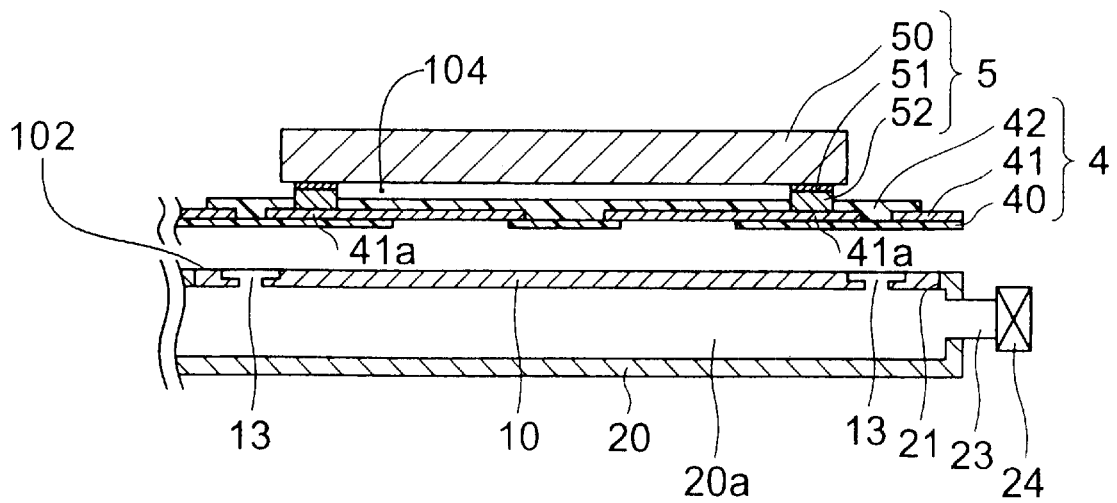

Next, as shown in FIG. 4B, the valve 24 of the mounting board holding jig 100 is loosened for easing the reduced pressure state of the hollow portion 20a and thereby release the hold of the flexible tape substrate 4 with the semiconductor device 5 soldered to it, easily with little stress.

Furthermore, after the above soldering of the semiconductor device 5 to the flexible tape substrate 4, sealing resin 8 is injected into the gap 104 between the flexible tape substrate 4 and the semiconductor device 5 and hardened in the state with the flexible tape substrate 4 soldered with the semiconductor device 5 held on the mounting board holding surface 102. Therefore, resin sealing is possible for easing the stress at flip-chip soldered portions while holding the flexible tape substrate 4 flat and stable.

The above method will be explained further below.

Figure 5A:
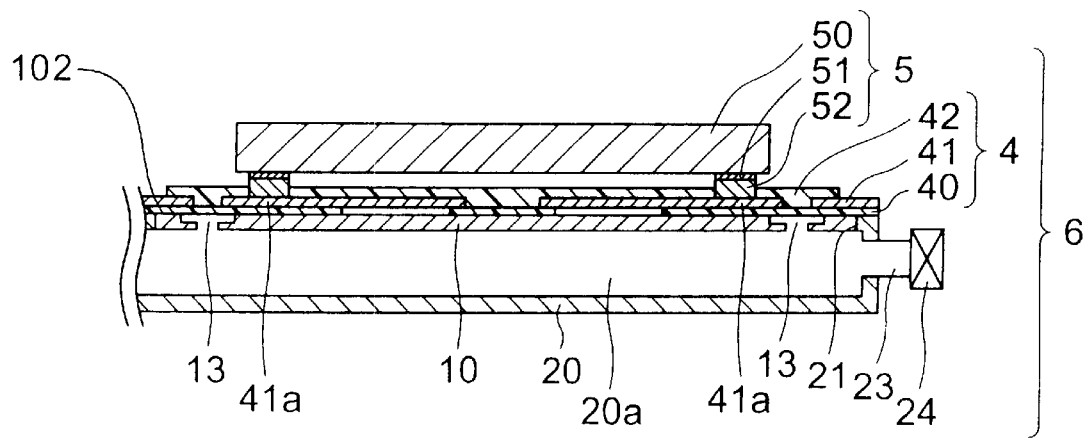

FIG. 5A shows the state of the flexible tape substrate 4 with the semiconductor device 5 shown in FIG. 4A soldered to it held on the mounting board holding surface 102. The flexible tape substrate 4 with the semiconductor device 5 soldered to it held on the mounting board holding surface 102 of the above mounting board holding jig 100 is called a "work 6" in the same way as above.

Figure 5B:
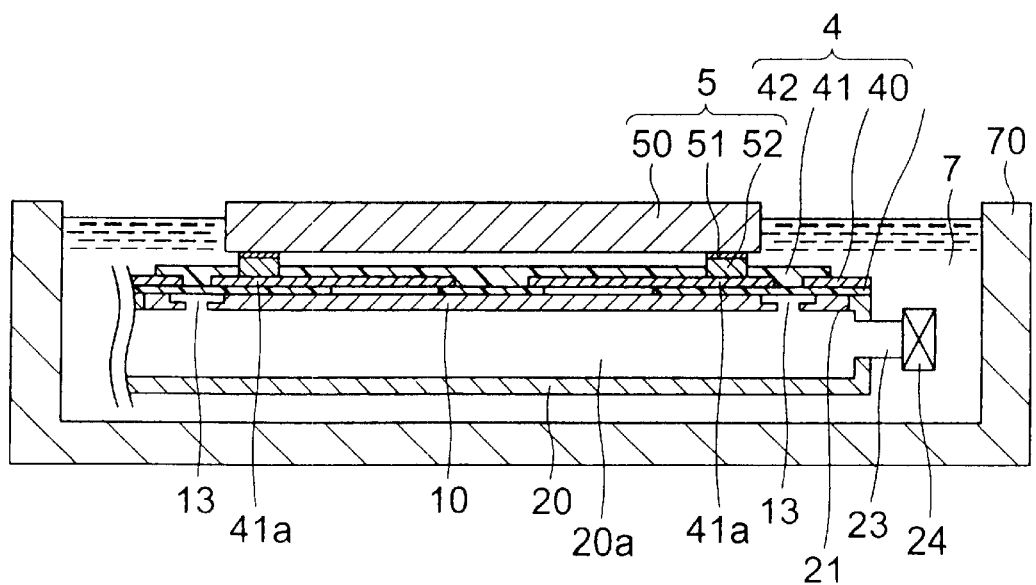

The work 6 in the state shown in FIG. 5A is dipped in a flux residue washing solution 7 in a flux washing bath 70 as shown in FIG. 5B. At this time, at least the solder junction portions are sufficiently dipped in the flux residue washing solution 7. Due to this, flux 41b residue (not shown) arising at the time of soldering is washed off.

As the above flux residue washing solution 7, for example Elise (phonetic) M9000 (product name, Asahi-Kasei Co.) etc. may be used.

Figure 6A:
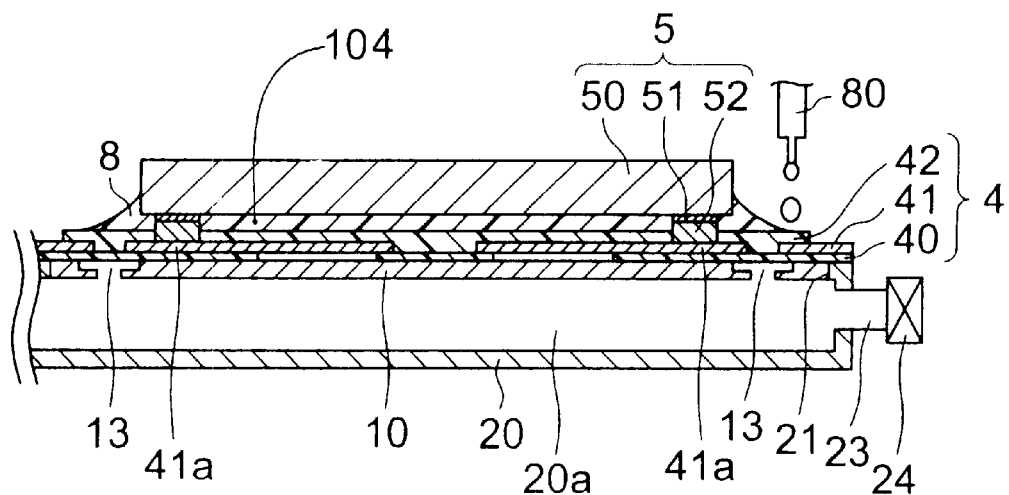

Next, as show in FIG. 6A, a heat curing resin, that is, an epoxy resin or other sealing resin 8, is supplied from a dispenser 80 to pervade the gap 104 between the semiconductor device 5 and the flexible tape substrate 4.

Then, heat treatment is performed for curing the sealing resin 8 to seal with resin 8 the flip-chip soldered portions 52 while holding the flexible tape substrate 4 flat and stable.

Figure 6B:
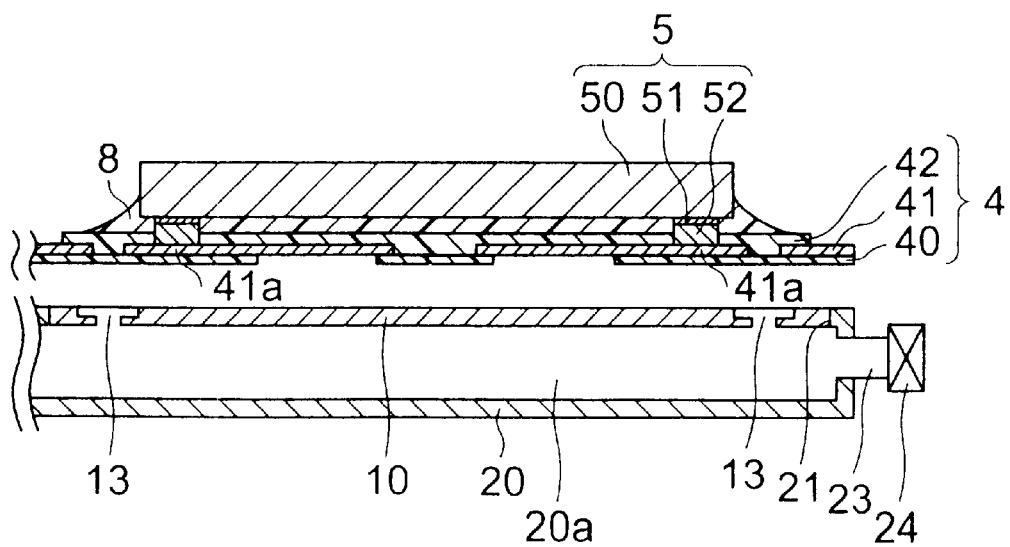

Next, as shown in FIG. 6B, the valve 24 of the mounting board holding jig 100 is loosened to release the reduced pressure state of the hollow portion 20a and thereby enable release of the hold on the flexible tape substrate 4 with the semiconductor device 5 soldered to it and with the resin 8 sealed soldered portions 52 easily with small stress to the semiconductor device 5.

According to the present embodiment, by placing a mounting board 4 on the mounting board holding surface 102 and applying suction from the suction holes 11, it is possible to hold a flexible tape substrate 4 or other mounting board 4 having a high flexibility flat and stable to permit mounting a semiconductor device 5 on the mounting board 4 by flip-chip mounting etc.

Also, by releasing the suction and returning to a normal pressure, the hold can be easily released without applying stress to the semiconductor device 5.

Furthermore, by injecting sealing resin 8 into the gap 104 between the mounting board 4 and the semiconductor device 5 and hardening the resin 8 in a state holding the mounting board 4 on the mounting board holding surface 102, resin 8 sealing is possible while holding a flexible tape substrate 4 or other mounting board 4 flat and stable.

Figure 7:
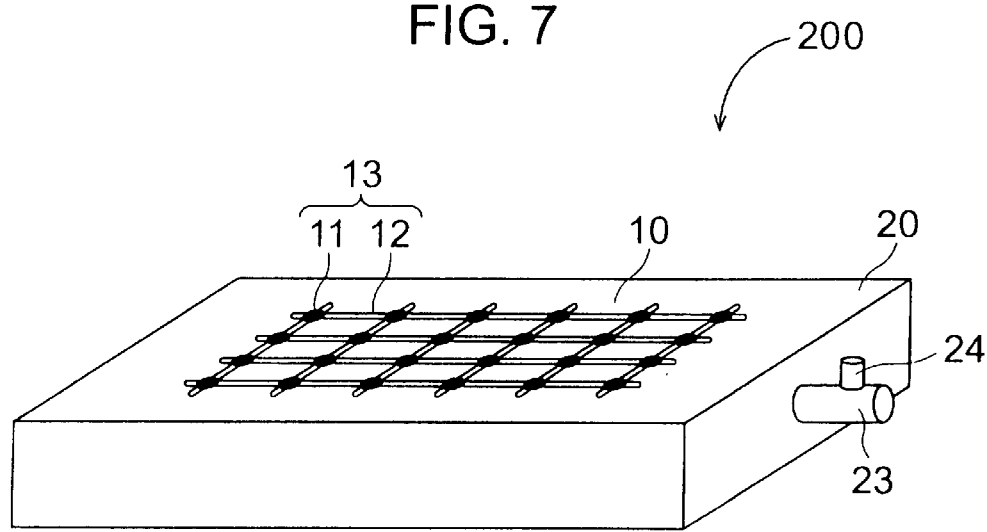
FIG. 7 is a perspective view of a semiconductor device mounting jig according to an embodiment of the present invention.

Note that as the mounting board holding jig 200, as shown in FIG. 7, the holding plate 1 and the plate support 2 may be integrally formed. As a method of forming an integrated jig 200, there is a method of brazing a separately made holding portion 1 and plate support 2 to eliminate the need for the O-ring 22.

Figure 8:
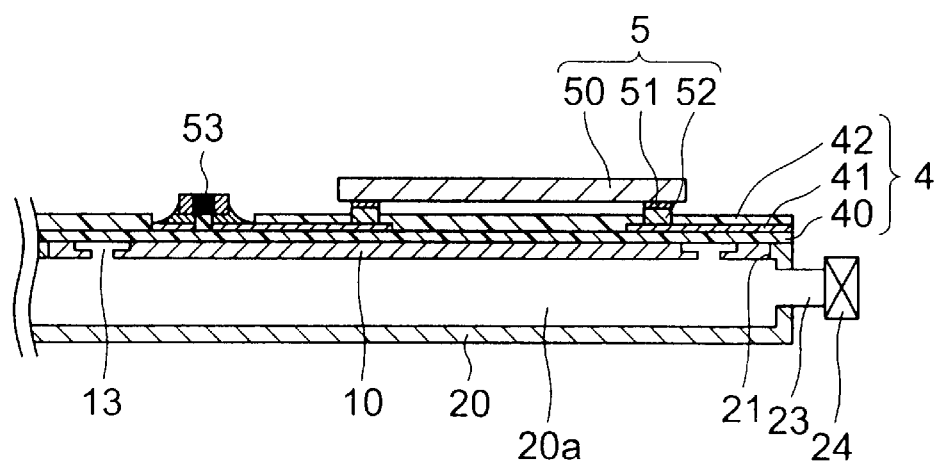
FIG. 8 is schematic sectional view of a method of mounting a semiconductor device according to an embodiment of the present invention.
Figure 9:
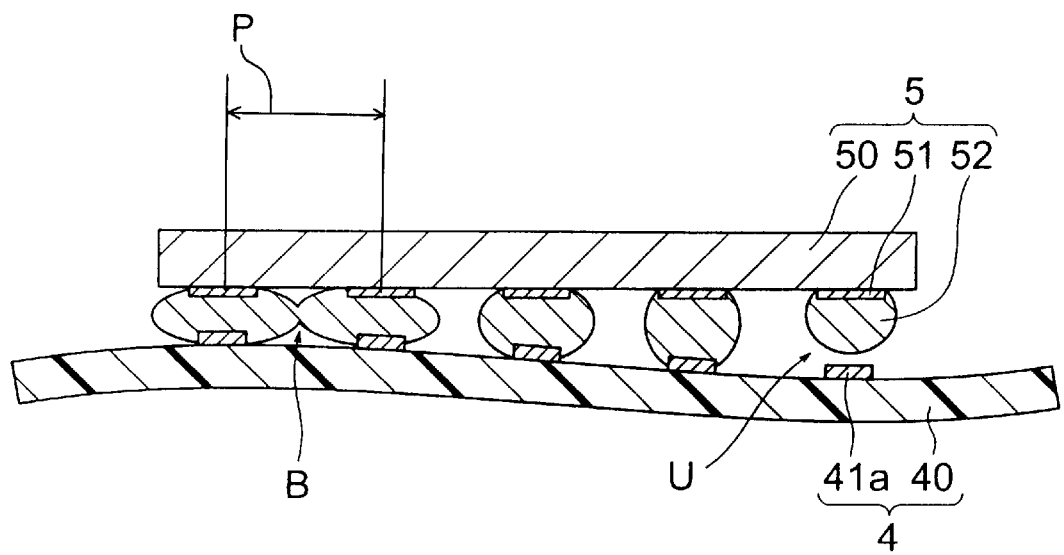
FIG. 9 is a sectional view showing a disadvantage of the method of mounting a semiconductor device according to the related art.

Also, in the above embodiments, as shown in FIG. 8, it is of course possible to hold the flexible tape substrate 4 or other mounting board 4 by the above mounting board holding jig 200, mount together a surface mounting device 53 besides a semiconductor device 5 formed with solder bumps 52, and mount the same by reflow.

The semiconductor device 300 produced by the present invention may be any semiconductor device 5 such as a MOS transistor type semiconductor device 5, a bipolar type semiconductor device 5, BiCMOS type semiconductor device 5, or semiconductor device 5 with a logic and a memory.

The semiconductor device 5 mounting jig 100 or 200 (mounting board holding jig) and method of mounting a semiconductor device 5 are not limited to the above embodiments.

For example, in the present embodiment, suction holes 11 are arranged in a lattice on the suction plate 10 and grooves 12 are arranged crossing the suction holes 11 to form a check pattern 13, however, the arrangement of the suction holes 11 and grooves 12 can be changed in accordance with the arrangement 41 of the lands (electrodes) 41*a* of the mounting board 4. The grooves 12 can be also omitted in accordance with need.

Also, the configuration and components of the semiconductor device 5 and the mounting board 4 are not limited to those explained in the above embodiments.

A variety of modification other than the above can be made within the scope of the present invention.

Summarizing the effects of the invention, as explained above, according to a semiconductor device 5 mounting jig 100, 200 of the present invention, in a process of mounting a semiconductor device 5 on a flexible tape substrate 4 by flip-chip mounting, a flexible tape substrate 4 can be held flat and stable and, furthermore, no stress is imposed on the semiconductor device 5 at the time of releasing the hold.

Also, according to the method of mounting a semiconductor device 5 of the present invention, by using the above semiconductor device 5 mounting jig 100, 200 of the present invention, a flexible tape substrate 4 or other board 4 can be held flat and stable and a semiconductor device 5 can be mounted stably by flip-chip mounting.

While the invention has been described with reference to specific embodiment chosen for purpose of illustration, it should be apparent that numerous modifications could be made thereto by those skilled in the art without departing from the basic concept and scope of the invention.

What is claimed is:

1. A semiconductor device mounting jig to mount a semiconductor device to a flexible tape substrate having a plurality of land electrodes disposed in a land electrode pattern, the jig comprising:

a suction plate having a flat surface and a plurality of suction holes penetrated through the suction plate, wherein the plurality of suction holes are disposed in a suction pattern such that none of the suction holes are configured to have an area in common with any of the land electrodes;

a plate support having a plate support body, wherein the plate support body defines an opening that leads to a hollow portion and wherein the suction plate is disposed in the opening of the plate support; and a suction nozzle coupled to the plate support and configured to provide a vacuum to the hollow portion, wherein the suction nozzle comprises a valve.

2. The jig of claim 1, wherein the suction plate and the plate support are solder together using a hard solder with a high melting point.

3. The jig of claim 1, wherein the opening of the plate support includes an O-ring disposed about an inner wall of the opening so as to be disposed between the plate support and the suction plate.

4. The jig of claim 1, wherein the suction plate is a first suction plate of a plurality of suction plates, wherein each suction plate includes a plurality of suction holes penetrated through the suction plate and disposed in a suction pattern, and wherein each suction pattern is different from the remaining suction patterns.

5. The jig of claim 1, further comprising:

a suction pump detachably coupled to the suction nozzle, wherein a plurality of grooves connects the plurality of suction holes to one another, wherein each hole substantially is defined by a diameter of 0.01 mm to 1.00 mm, and wherein a width of each grove is equal to the diameter of a hole.

* * * * *